US011932111B2

(12) United States Patent
Minami et al.

(10) Patent No.: US 11,932,111 B2
(45) Date of Patent: Mar. 19, 2024

(54) RECTIFIER AND VEHICLE AC GENERATOR PROVIDED THEREWITH

(71) Applicant: Mitsubishi Electric Corporation, Tokyo (JP)

(72) Inventors: Shinichiro Minami, Tokyo (JP); Katsuya Tsujimoto, Tokyo (JP); Keiichi Komurasaki, Tokyo (JP); Shingo Inoue, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 535 days.

(21) Appl. No.: 17/254,354

(22) PCT Filed: Aug. 3, 2018

(86) PCT No.: PCT/JP2018/029169
§ 371 (c)(1),
(2) Date: Dec. 21, 2020

(87) PCT Pub. No.: WO2020/026427
PCT Pub. Date: Feb. 6, 2020

(65) Prior Publication Data
US 2021/0257888 A1 Aug. 19, 2021

(51) Int. Cl.
*B60K 6/26* (2007.10)
*H02P 9/30* (2006.01)
*H05K 7/20* (2006.01)

(52) U.S. Cl.
CPC ............... *B60K 6/26* (2013.01); *H02P 9/305* (2013.01); *H05K 7/20909* (2013.01)

(58) Field of Classification Search
CPC ....... B60K 6/26; H02P 9/305; H05K 7/20909; Y02B 70/10; H02K 11/05; H02M 1/0048; H02M 1/0085; H02M 7/219; H02M 7/003
See application file for complete search history.

(56) References Cited

U.S. PATENT DOCUMENTS 5,646,866 A 7/1997 Coelho et al.
5,650,941 A 7/1997 Coelho et al.
(Continued)

FOREIGN PATENT DOCUMENTS

JP 8-033228 A 2/1996
JP 1023768 A 1/1998
(Continued)

OTHER PUBLICATIONS

JP H11225446 A (Year: 1999).*
(Continued)

*Primary Examiner* — Thomas Truong
(74) *Attorney, Agent, or Firm* — Sughrue Mion, PLLC; Richard C. Turner

(57) ABSTRACT

A rectifier and a vehicle AC generator that can suppress the cost, the rectification loss, and the leakage current from increasing are provided. A rectifier is configured in such a way that in each of n sets, one of a positive electrode side semiconductor device and a negative electrode side semiconductor device is a MOSFET, in such a way that in at least one of the n sets, the other one of the positive electrode side semiconductor device and the negative electrode side semiconductor device is a specific diode, and in such a way that the specific diode is a Schottky barrier diode or a MOS diode, which is a MOSFET whose drain terminal and gate terminal are short-circuited.

14 Claims, 11 Drawing Sheets

(56) References Cited

U.S. PATENT DOCUMENTS

| | | | |
|---|---|---|---|
| 5,748,196 A | 5/1998 | Coelho et al. | |
| 2001/0029095 A1* | 10/2001 | Tadauchi | B23K 35/025 |
| | | | 438/118 |
| 2015/0162846 A1 | 6/2015 | Yokoyama et al. | |
| 2018/0115214 A1* | 4/2018 | Akiyoshi | H02K 19/365 |
| 2019/0036460 A1 | 1/2019 | Yokoyama et al. | |
| 2021/0257888 A1* | 8/2021 | Minami | H02K 11/05 |

FOREIGN PATENT DOCUMENTS

| | | |
|---|---|---|
| JP | 10-146047 A | 5/1998 |
| JP | 11-225446 A | 8/1999 |
| JP | 2005-341730 A | 12/2005 |
| WO | 99/36966 A1 | 7/1999 |
| WO | 2014/083609 A1 | 6/2014 |
| WO | 2016/174731 A1 | 11/2016 |

OTHER PUBLICATIONS

JP H1023768 A (Year: 1998).*
JP H10146047 A (Year: 1998).*
JP H0833228 A (Year: 1996).*
Communication dated Jun. 28, 2021, from the European Patent office in application No. 18928255.1.
Communication dated Sep. 29, 2022 from the European Patent office in EP application No. 18928255.1.
Office Action dated Apr. 13, 2021 from the Japanese Patent Office in JP Application No. 2020-534010.
International Search Report for PCT/JP2018/029169 dated Aug. 28, 2018.
Communication dated Dec. 29, 2023, issued in Chinese Application No. 201880096187.6.

* cited by examiner

| | MOSFET + SBD | SBD + SBD |
|---|---|---|
| RECTIFICATION LOSS [W] | 79 ▲35% | 122 |

RECTIFIER AND VEHICLE AC GENERATOR PROVIDED THEREWITH

CROSS-REFERENCE TO RELATED APPLICATIONS

This application is a National Stage of International Application No. PCT/JP2018/029169 filed Aug. 3, 2018.

TECHNICAL FIELD

The present disclosure relates to a rectifier and a vehicle AC generator provided therewith.

BACKGROUND ART

In a technology disclosed in PLT 1, in order to reduce rectification loss in a rectifier so as to raise power generation efficiency of a vehicle AC generator, a Schottky barrier diode, with which more forward drop voltage can be reduced than that with a PN-junction diode, is utilized for each of a positive electrode side semiconductor device and a negative electrode side semiconductor device.

CITATION LIST

Patent Literature

PLT 1: WO 1999/36966

SUMMARY OF INVENTION

Technical Problem

However, there has been a problem that when a Schottky barrier diode is utilized for each of a positive electrode side semiconductor device and a negative electrode side semiconductor device, a leakage current becomes large, especially at a high temperature, in comparison with a PN-junction diode. Because when a leakage current becomes large, heat generation in a device becomes large, it is required that when a Schottky barrier diode is utilized for each of a positive electrode side semiconductor device and a negative electrode side semiconductor device, thermal design for a cooling mechanism and the like is deliberately performed so that no thermal runaway occurs.

In device design for a Schottky barrier diode, there exists a trade-off relationship between a decrease in a forward drop voltage and an increase in a leakage current. Therefore, it is desired that in order to reduce rectification loss more, a Schottky barrier diode, among those, that has a lower forward drop voltage is adopted; however, because a leakage current increases, it cannot easily be adopted.

Meanwhile, because a MOSFET is expensive although its voltage drop can be reduced and its leakage current is small in comparison with a Schottky barrier diode, it has been a problem that use of a MOSFET for each of positive and negative polarities increases the cost.

Thus, a rectifier and a vehicle AC generator that can suppress the cost, the rectification loss, and the leakage current from increasing are desired.

Solution to Problem

A rectifier according to the present disclosure, including n (n is a natural number of 2 or larger) sets of series circuits in each of which a positive electrode side semiconductor device to be connected with a positive electrode side output terminal and a negative electrode side semiconductor device to be connected with a negative electrode side output terminal are connected in series with each other and a series-connection connection point is connected with a corresponding AC power source, wherein each of the positive electrode side semiconductor device and the negative electrode side semiconductor device has at least a rectification function of making a current flow from a negative electrode side to a positive electrode side, wherein in each of the n sets, one of the positive electrode side semiconductor device and the negative electrode side semiconductor device is a MOSFET, wherein in at least one of the n sets, the other one of the positive electrode side semiconductor device and the negative electrode side semiconductor device is a specific diode, and wherein the specific diode is a Schottky barrier diode or a MOS diode, which is a MOSFET whose drain terminal and gate terminal are short-circuited.

A vehicle AC generator according to the present disclosure including the foregoing rectifier and windings of the n phases, as the AC power sources.

Advantage of Invention

In the rectifier and the vehicle AC generator according to the present disclosure, in at least one of the n sets, the specific diode is utilized at the other one of the positive electrode side and the negative electrode side; therefore, the cost can be reduced in comparison with the case where a MOSFET is utilized at each of the positive electrode side and the negative electrode side. Moreover, because a MOSFET is utilized at one of the positive electrode side and the negative electrode side, the rectification loss can be reduced, in comparison with the case where a Schottky barrier diode is utilized at each of the positive electrode side and the negative electrode side. Moreover, the MOSFET provided at one of the positive electrode side and the negative electrode side can reduce the leakage current; thus, even when a Schottky barrier diode is utilized, the leakage current that flows in the series circuit can be suppressed from increasing. In addition, because the leakage current of a MOS diode is small, the leakage current can be suppressed from increasing. Thus, the cost, the rectification loss, and the leakage current can be suppressed from increasing.

DESCRIPTION OF EMBODIMENTS

1. Embodiment 1

Figure 1:
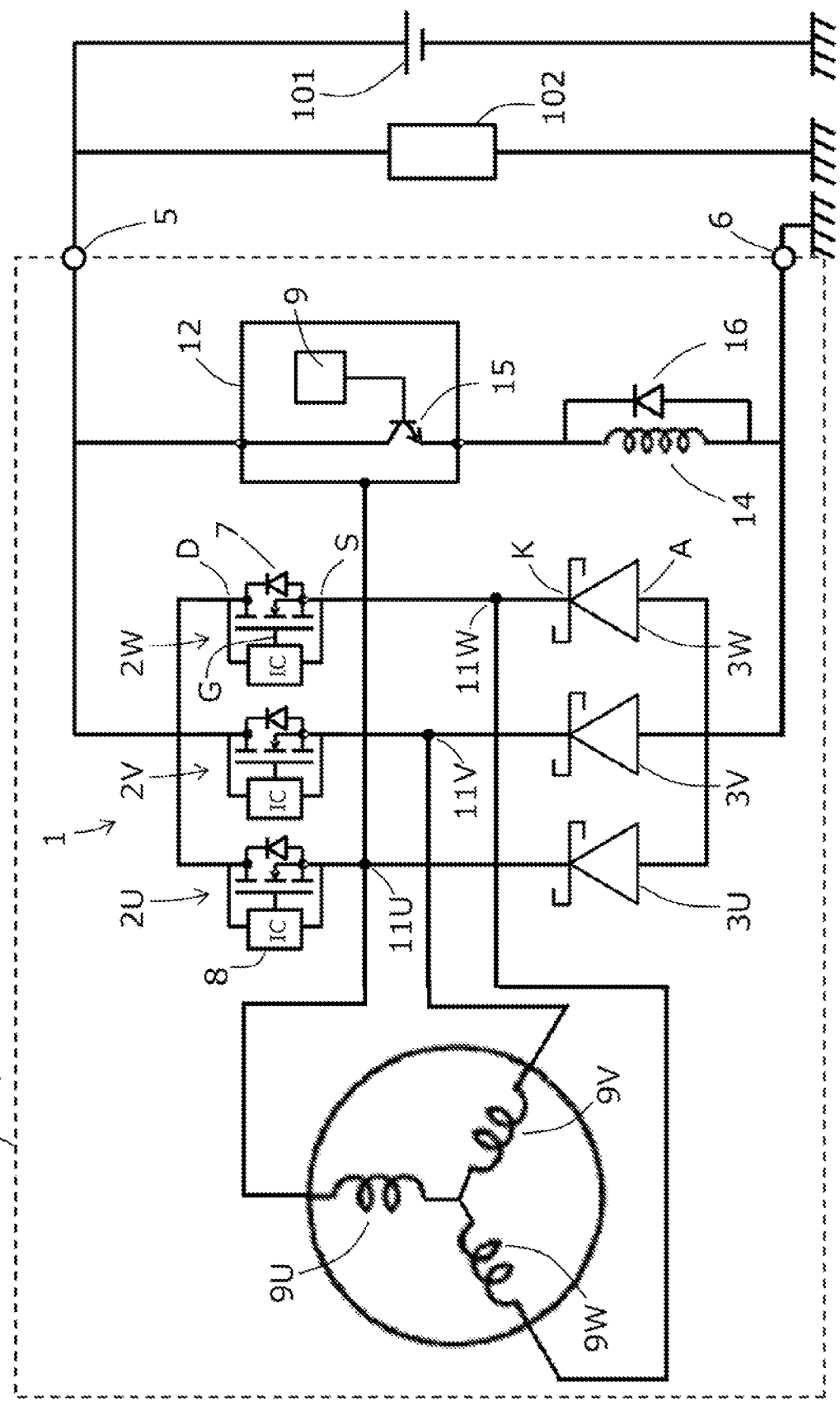
FIG. 1 is a circuit diagram of a rectifier and a vehicle power generator according to Embodiment 1.

A rectifier 1 and a vehicle power generator 10 provided with the rectifier 1 according to Embodiment 1 will be explained with reference to the drawings. FIG. 1 is a circuit diagram of the rectifier 1 and the vehicle power generator 10.

1-1. Circuit Configuration of Vehicle Power Generator 10

Figure 6:
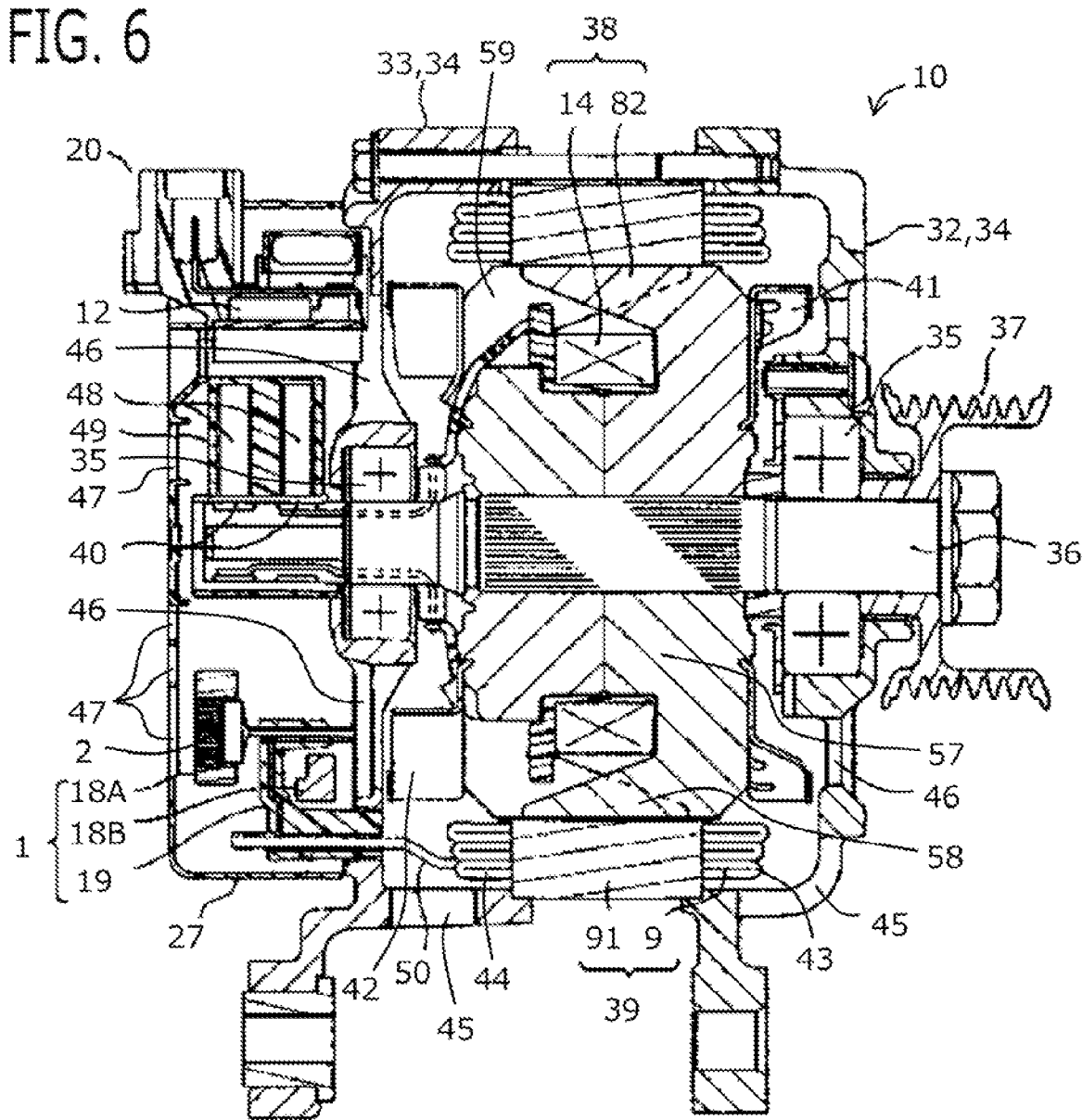
FIG. 6 is a cross-sectional view of the vehicle power generator according to Embodiment 1.

The vehicle power generator 10 has a stator 39 fixed to a housing 34 and a rotor 38 that is disposed at the radial inside of the stator 39 and is pivotably supported by the housing 34 (refer to FIG. 6). Windings 9U, 9V, and 9W of three phases are provided in the stator 39, and a magnetic-field winding 14 is provided in the rotor 38. The windings 9U, 9V, and 9W of the three phases are star-connected. The windings 9U, 9V, and 9W of the three phases may be either delta-connected or zigzag-connected. The vehicle power generator 10 generates electric power by means of rotation-driving force of an engine. A rotation axle 36 of the rotor 38 is coupled with a crankshaft of the engine through the intermediary of a coupling mechanism such as a pulley or a belt.

The magnetic-field winding 14 is connected in series with a switching device 15 for the magnetic-fields winding between a positive electrode side output terminal 5 and a negative electrode side output terminal 6. A recirculation diode 16 is connected in parallel with the magnetic-field winding 14 and recirculates a current flowing in the magnetic-field winding 14, when the switching device 15 for the magnetic-fields winding is off. As the switching device 15 for the magnetic-fields winding, a MOSFET or the like is utilized. The gate terminal of the switching device 15 for the magnetic-fields winding is connected with a driving circuit 9 provided in a voltage control circuit 12. The voltage control circuit 12 is connected with the winding 9U of U phase and detects the rotation speed of the rotor 38, based on a change in the terminal voltage of the U-phase winding 9U. The voltage control circuit 12 on/off-drives the switching device 15 for the magnetic-fields winding so that the generation voltage of the vehicle power generator 10 approaches a target voltage (e.g. 14 V).

The vehicle power generator 10 has the rectifier 1 for rectifying a three-phase AC voltage outputted from the windings 9U, 9V, and 9W of the three phases so as to convert it into a DC voltage. The rectifier 1 is provided with three sets of series circuits in each of which a positive electrode side semiconductor device 2 to be connected with the positive electrode side output terminal 5 and a negative electrode side semiconductor device 3 to be connected with the negative electrode side output terminal 6 are connected with each other. A connection point 11 at which the positive electrode side semiconductor device 2 and the negative electrode side semiconductor device 3 are connected in series with each other is connected with the corresponding winding as an AC power source.

The positive electrode side output terminal 5 and the negative electrode side output terminal 6 are connected with an electric load 102 and an electric storage device 101. In the present embodiment, the electric storage device 101 is a lead-acid battery of 14 V.

Each of the positive electrode side semiconductor device 2 and the negative electrode side semiconductor device 3 has at least a rectification function of making a current flow from the negative electrode side to the positive electrode side. In each of the three sets, one of the positive electrode side semiconductor device 2 and the negative electrode side semiconductor device 3 is a MOSFET (Metal Oxide Semiconductor Field Effect Transistor). In at least one of the three sets (in each of the three sets, in this example), the other one of the positive electrode side semiconductor device 2 and the negative electrode side semiconductor device 3 is a specific diode.

In the present embodiment, the specific diode is a Schottky barrier diode (hereinafter, referred to as an SBD). An SBD is a diode utilizing a Schottky barrier produced by joining metal and a semiconductor. In general, although in comparison with a PN-junction diode, the forward drop voltage of an SBD is low and the switching speed thereof is high, the backward leakage current thereof is large and the backward breakdown voltage thereof is low. In each of the three sets, the positive electrode side semiconductor device 2 is a MOSFET. In each of the three sets, the negative electrode side semiconductor device 3 is an SBD.

In the series circuit of each phase, a drain terminal D of the positive electrode side MOSFET is connected with the positive electrode side output terminal 5; a source terminal S of the positive electrode side MOSFET is connected with a cathode terminal K of the negative electrode side SBD; an anode terminal A of the negative electrode side SBD is connected with the negative electrode side output terminal 6. The connection point 11 at which the positive electrode side MOSFET and the negative electrode side SBD are connected with each other is connected with the corresponding winding.

The positive electrode side MOSFET has a PN-junction parasitic diode 7; the cathode terminal of the parasitic diode 7 is connected with the positive electrode side output terminal 5 side; the anode terminal of the parasitic diode 7 is connected with the negative electrode side output terminal 6 side. Accordingly, each of the parasitic diode 7 of the positive electrode side MOSFET and the negative electrode side SBD has a rectification function of making a current flow from the negative electrode side to the positive electrode side.

Reduction of Rectification Loss

The rectifier 1 has control circuits 8 for on/off-driving of the respective positive electrode side MOSFETs. In the present embodiment, each of the positive electrode side MOSFETs has an IC (Integrated Circuit) as the control circuits 8 for on/off-driving of the MOSFET. The control circuit 8 is connected between the drain terminal D and the source terminal S and detects the respective voltages of the drain terminal D and the source terminal S. In addition, the control circuit 8 is connected with a gate terminal G of the MOSFET; when the voltage of the source terminal S exceeds the voltage of the drain terminal D, the control circuit 8 outputs an ON-signal to the gate terminal G so as to turn on the MOSFET. In contrast, when the voltage of the source terminal S is lower than the voltage of the drain terminal D, the control circuit 8 outputs an OFF-signal to the gate terminal G so as to turn off the MOSFET. For example, the control circuit 8 sets a MOSFET-ON time point with reference to a time point at which a differential voltage obtained by subtracting the voltage of the drain terminal D from the voltage of the source terminal S exceeds a preliminarily set ON-determination threshold value and sets a MOSFET-OFF time point with reference to a time point at which the differential voltage becomes smaller than a preliminarily set OFF-determination threshold value.

Figures 2, 3:
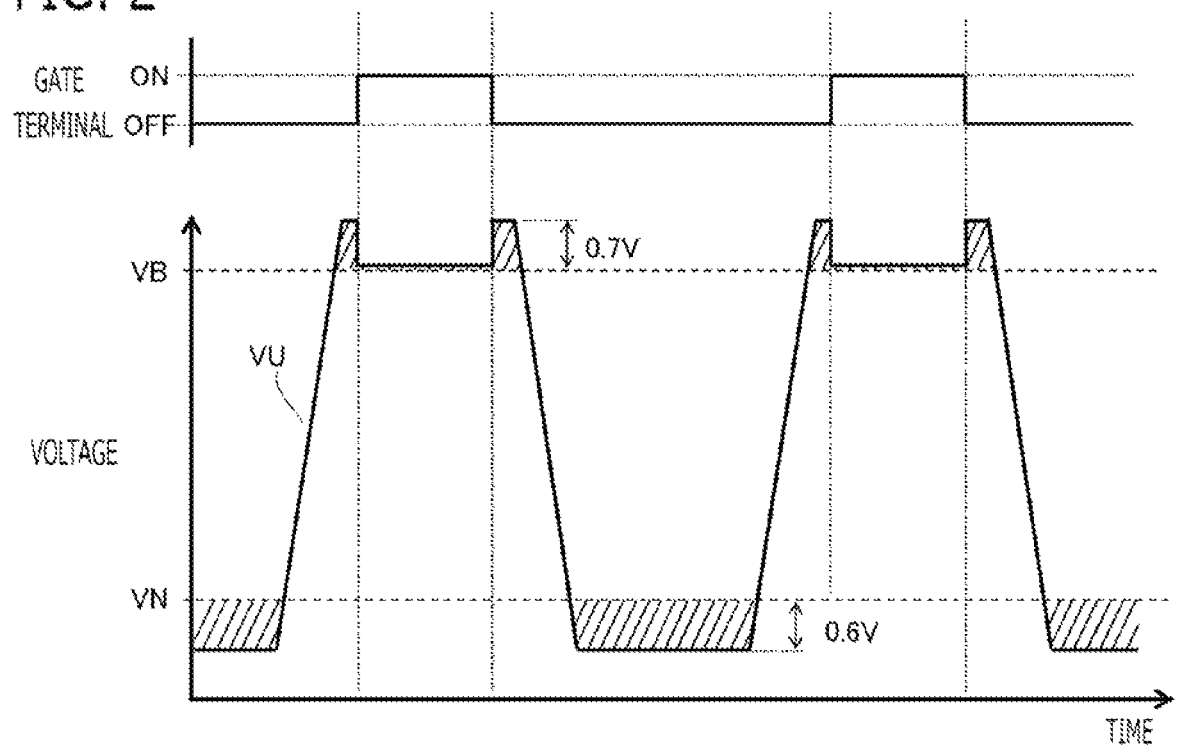
FIG. 2 is a timing chart for explaining a phase voltage waveform according to Embodiment 1.
FIG. 3 is a drawing for explaining reduction of rectification loss according to Embodiment 1.

FIG. 2 represents the phase voltage waveform of any one of the phases (e.g., U phase). A U-phase phase voltage VU corresponds to the voltage of the connection point 11U with which the U-phase winding is connected and becomes equal to the respective voltages of the source terminal S of the U-phase positive electrode side MOSFET and the cathode terminal K of the U-phase negative electrode side SBD. The voltage VB of the positive electrode side output terminal 5 becomes equal to the voltage of the drain terminal D of the U-phase positive electrode side MOSFET. The voltage VN of the negative electrode side output terminal 6 becomes equal to the voltage of the anode terminal A of the U-phase negative electrode side SBD.

As represented in FIG. 2, in a time period during which the U-phase phase voltage VU (the voltage of the source terminal S) is higher than the voltage VB (the voltage of the drain terminal D) of the positive electrode side output terminal 5, the U-phase positive electrode side MOSFET is turned on. In the present embodiment, in the both sides of the time period during which the U-phase phase voltage VU is higher than the voltage VB, the U-phase positive electrode side MOSFET is turned off.

When the MOSFET is turned on, the source terminal S and the drain terminal D are conductively connected with each other; the drop voltage from the source terminal S to the drain terminal D becomes a voltage obtained by multiplying the resistance in the MOSFET, especially in a n-type semiconductor, by an energizing current; for example, the drop voltage becomes a voltage of 0.1 V or lower under the condition of 25° C. and 100 A energization. In contrast, when the MOSFET is turned off, the drop voltage from the source terminal S to the drain terminal D becomes the forward drop voltage of the PN-junction parasitic diode 7; for example, the drop voltage becomes a voltage of substantially 0.7 V under the condition of 25° C. and 100 A energization. Accordingly, when the MOSFET is turned on in the time period during which the voltage of the source terminal S is higher than the voltage of the drain terminal D, the rectification loss in the MOSFET can largely be reduced. In addition, the rectification loss becomes the integration value of a value obtained by multiplying the drop voltage, represented by the hatching in FIG. 2, by the energizing current.

In contrast, in the time period during which the U-phase phase voltage VU (the voltage of the cathode terminal K) is lower than the voltage VN of the negative electrode side output terminal 6 (the voltage of the anode terminal A), the drop voltage from the anode terminal A to the cathode terminal K becomes the forward drop voltage of the SBD; for example, the drop voltage becomes substantially 0.6 V under the condition of 25° C. and 100 A energization; thus, the rectification loss corresponding to the drop voltage of 0.6 V occurs.

As represented in FIG. 3, in comparison with an comparative example in which an SBD is utilized as each of the positive electrode side semiconductor device and the negative electrode side semiconductor device, the present embodiment in which a MOSFET is utilized at the positive electrode side and an SBD is utilized at the negative electrode side makes it possible to reduce the rectification loss by 35%; thus, the power generation efficiency of the vehicle power generator 10 can be raised.

Reduction of Leakage Current

As described above, when a backward voltage is applied, the leakage current of an SBD that flows from the cathode terminal K to the anode terminal A is larger than that of a PN-junction diode. In addition, as the temperature of the device rises, the leakage current of an SBD becomes larger.

Figure 4:
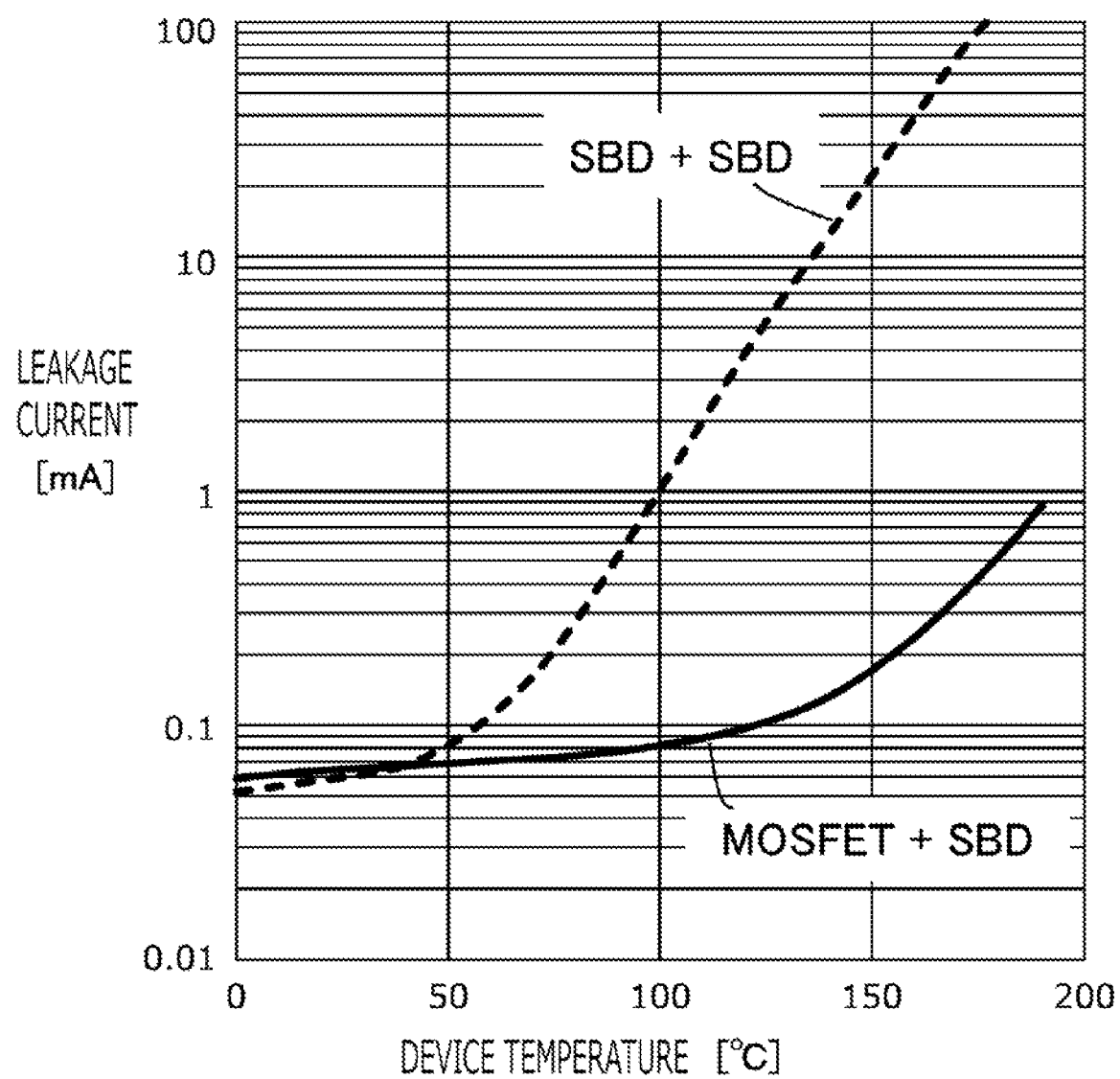
FIG. 4 is a drawing for explaining reduction of a leakage current according to Embodiment 1.

FIG. 4 represents the leakage current in the rectifier 1 at a time when the vehicle power generator 10 is stopped. Even when the vehicle power generator 10 is stopped, the voltage across the electric storage device 101 is applied to the rectifier 1. In a comparative example in which an SBD is utilized at each of the positive electrode side and the negative electrode side, as the temperature of the device rises, the leakage current that flows from the positive electrode side to the negative electrode side in each of the series circuits becomes exponentially larger. For example, at the device temperature of 120° C., a leakage current of several milliamperes occurs. Because when a leakage current becomes large, heat generation in a device becomes large, it is required that in the comparative example, thermal design for a cooling mechanism and the like is deliberately performed so that no thermal runaway occurs.

In contrast, in the case of a MOSFET, the leakage current in the PN-junction parasitic diode 7 becomes small in comparison with an SBD. Accordingly, in the present embodiment in which a MOSFET is utilized at the positive electrode side and an SBD is utilized at the negative electrode side, the positive electrode side MOSFET can reduce the leakage current in each of the series circuits; thus, even when the device temperature rises, the leakage current that flows in each of the series circuits is suppressed from increasing. For example, at the device temperature of 120° C., the leakage current can be suppressed to substantially 0.1 mA. As a result, in the present embodiment, the anxiety of a thermal runaway can be eliminated and hence the reliability of the apparatus can be raised.

Protection of MOSFET from High-Voltage Surge

In the case where while the vehicle power generator 10 generates electric power, the electric load 102 and the electric storage device 101 are abruptly cut off because for example, the positive electrode side output terminal 5 is disconnected, the current flowing in the magnetic-field winding 14 does not immediately become zero but is attenuated with the time constant of the magnetic-field winding 14; therefore, a high-voltage surge occurs in each of the windings 9U, 9V, and 9W of the three phases.

The breakdown voltage of the negative electrode side SBD is lower than the clamp voltage of the positive electrode side MOSFET. The positive electrode side MOSFET has a clamp circuit; when the drain-source differential voltage obtained by subtracting the voltage of the source terminal S from the voltage of the drain terminal D becomes the same as or larger than the clamp voltage, the clamp circuit makes a current flow from the drain terminal D to the source terminal S so that the drain-source differential voltage does not exceed the clamp voltage. The clamp voltage is set to be lower than the breakdown voltage of the parasitic diode 7 so that the MOSFET does not fail due to the breakdown of the parasitic diode 7. The kinds of clamp circuits include, for example, an active clamp circuit in which a Zener diode is provided between the drain terminal D and the source terminal S and an avalanche clamp circuit in which a Zener diode is provided in such a way as to be connected with the MOSFET in an anti-parallel manner. In the present embodiment, the clamp circuit is contained in the control circuit 8 (IC).

Therefore, when a high-voltage surge occurs, the negative electrode side SBD breaks down before the clamp circuit of the positive electrode side MOSFET operates. Then, the terminal voltage of each of the windings 9U, 9V, and 9W of the three phases can be fixed to the breakdown voltage of the negative electrode side SBD, so that it is made possible to prevent an excessive voltage from being applied to the positive electrode side MOSFET.

Figure 5:
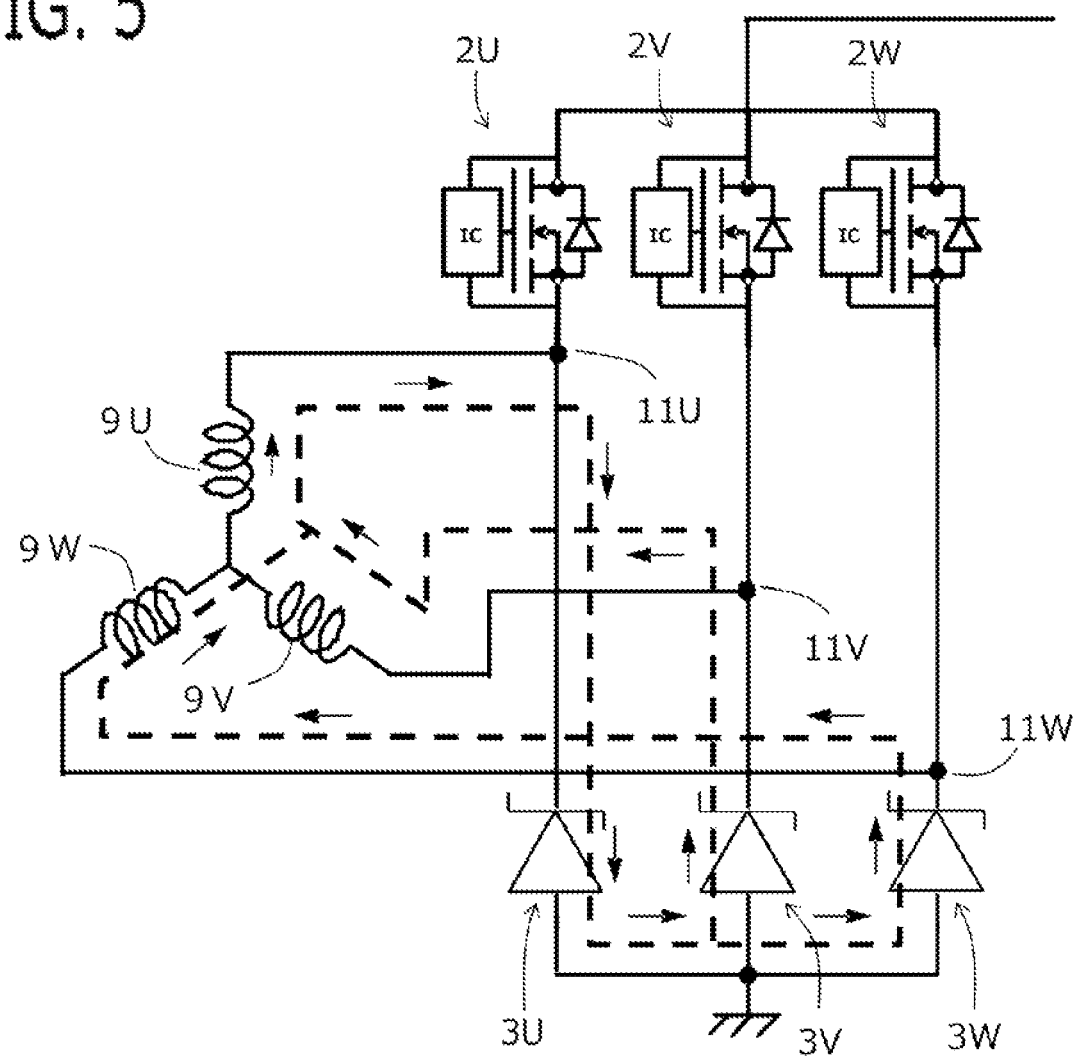
FIG. 5 is a diagram for explaining a current path according to Embodiment 1 at a time when a high-voltage surge occurs.

The current path at a time when a high-voltage surge occurs will be explained by use of FIG. 5. As indicated by arrows, when the phase voltage of the U-phase winding 9U becomes maximum and exceeds the breakdown voltage of a U-phase negative electrode side SBD 3U, a current flows from the U-phase winding 9U to the negative electrode side electric wire through the U-phase negative electrode side SBD 3U; thus, the electric potential difference between the negative electrode side electric wire and the connection point 11U of the U-phase series circuit is fixed to the breakdown voltage of the SBD. On the other hand, the phase voltage of the V-phase winding 9V becomes lower than the voltage of the negative electrode side electric wire and hence a current flows from the negative electrode side electric wire to the V-phase winding 9V through the V-phase negative electrode side SBD 3V; thus, the electric potential difference between the negative electrode side electric wire and a connection point 11V of the V-phase series circuit is fixed to the negative value of the forward drop voltage of the SBD. In addition, the phase voltage of the W-phase winding 9W becomes lower than the voltage of the negative electrode side electric wire and hence a current flows from the negative electrode side electric wire to the W-phase winding 9W through the W-phase negative electrode side SBD 3W; thus, the electric potential difference between the negative electrode side electric wire and a connection point 11W of the W-phase series circuit is fixed to the negative value of the forward drop voltage of the SBD. Due to the rotation of the rotor 38, the phases in which the respective phase voltages become maximum are interchanged and hence the states of the windings and the SBDs of the respective phases are interchanged.

As described above, because the three SBDs at the negative electrode side makes it possible that the respective voltages of the connection points 11U, 11V, and 11W of the series circuits of the three phases do not exceed the breakdown voltage of the SBD, an excessive voltage can be prevented from being applied to the positive electrode side MOSFET. Moreover, the three SBDs at the negative electrode side makes it possible that energy is consumed and hence the high-voltage surge is attenuated. Moreover, because the energy is consumed in a balanced manner by the three SBDs at the negative electrode side, heat generated in the SBDs can be prevented from being unevenly distributed. Thus, when a MOSFET is utilized at the positive electrode side and an SBD is utilized at the negative electrode side, the MOSFET can be protected from a high-voltage surge and the high-voltage surge can efficiently be attenuated through the power consumption in the SBD.

1-2. Structure of Vehicle Power Generator 10

Next, the structure of the vehicle power generator 10 will be explained. FIG. 6 is a cross-sectional view of the vehicle power generator 10 taken along a plane that passes through the center axis of the rotation axle 36. The vehicle power generator 10 has the stator 39 fixed to the housing 34 and the rotor 38 that is disposed at the radial inside of the stator 39 and is pivotably supported by the housing 34. The rotor 38 and the stator 39 are contained in the housing 34. The rotation axle 36 penetrates the central portion of the rotor 38 and rotates integrally with the rotor 38. The rotation axle 36 is pivotably supported by the housing 34 at the axial-direction both sides of the stator 39, through the intermediary of respective bearings 35.

Hereinafter, one side (the right side in FIG. 6) in the axial direction that is parallel to the center axis of the rotation axle 36 will be referred to as a front side; the other side (the left side in FIG. 6) in the axial direction will be referred to as a rear side. The housing 34 includes a front-side housing 32 and a rear-side housing 33. The front-side housing 32 has a cylindrical tubular outer circumference wall and a discoidal side wall that extends from the front-side end portion of the outer circumference wall toward the radial inside; in the central portion of the side wall, there is provided a through-hole that is penetrated by the rotation axle 36 and in which the bearing 35 is fixed. The rear-side housing 33 has a cylindrical tubular outer circumference wall and a discoidal side wall that extends from the rear-side end portion of the outer circumference wall toward the radial inside; in the central portion of the side wall, there is provided a through-hole that is penetrated by the rotation axle 36 and in which the bearing 35 is fixed. Bolts extending in the axial direction connects the front-side housing 32 with the rear-side housing 33.

The front-side end portion of the rotation axle 36 penetrates the through-hole in the front-side housing 32 and protrudes from the front-side housing 32 toward the front side; a pulley 37 is fixed to the protruding portion. A belt is wound around the pulley 37 and a pulley fixed on the crankshaft of the engine; rotation-driving force of the engine is transferred to the rotation axle 36.

The rear-side end portion of the rotation axle 36 penetrates the through-hole in the rear-side housing 33 and protrudes from the rear-side housing 33 toward the rear side; a pair of slip rings 40 is fixed to the protruding portion. The pair of slip rings 40 is connected with the magnetic-field winding 14 of the rotor 38.

The rotor 38 is of a LUNDELL type (referred to also as a claw-pole type). A magnetic-field iron core 82 of the rotor 38 is provided with a cylindrical tubular central portion 57, a front-side hook portion 58 that extends from the front-side end portion of the central portion 57 to the radial outside of the central portion 57, and a rear-side hook portion 59 that extends from the rear-side end portion of the central portion 57 to the radial outside of the central portion 57. An insulated copper wire of the magnetic-field winding 14 is wound concentrically on the outer circumferential surface of the central portion 57 of the magnetic-field iron core 82. The front-side hook portion 58 and the rear-side hook portion 59 are alternately provided in the circumferential direction and become magnetic poles that are different from each other. For example, 6 or 8 pieces each of the front-side hook portions 58 and the rear-side hook portions 59 are provided.

The stator 39 is disposed in such a way as to surround the rotor 38 via a minute gap and is provided with a cylindrical tubular stator iron core 91 having a slot and with the windings 9U, 9V, and 9W of the three phases wound around the slot in the stator iron core 91. Each of the windings 9U, 9V, and 9W of the three phases has a front-side coil end portion 43 protruding from the stator iron core 91 toward the front side and a rear-side coil end portion 44 protruding from the stator iron core 91 toward the rear side. A lead wire 50 of each of the windings 9U, 9V, and 9W of the three phases penetrates the rear-side housing 33 and extends toward the rear side.

The front-side housing 32 and the rear-side housing 33 are provided spaced apart from each other in the axial direction. The stator iron core 91 is pinched from both axis-direction ends by a rear-side opening end portion of the front-side housing 32 and a front-side opening end portion of the rear-side housing 33.

Figure 7:
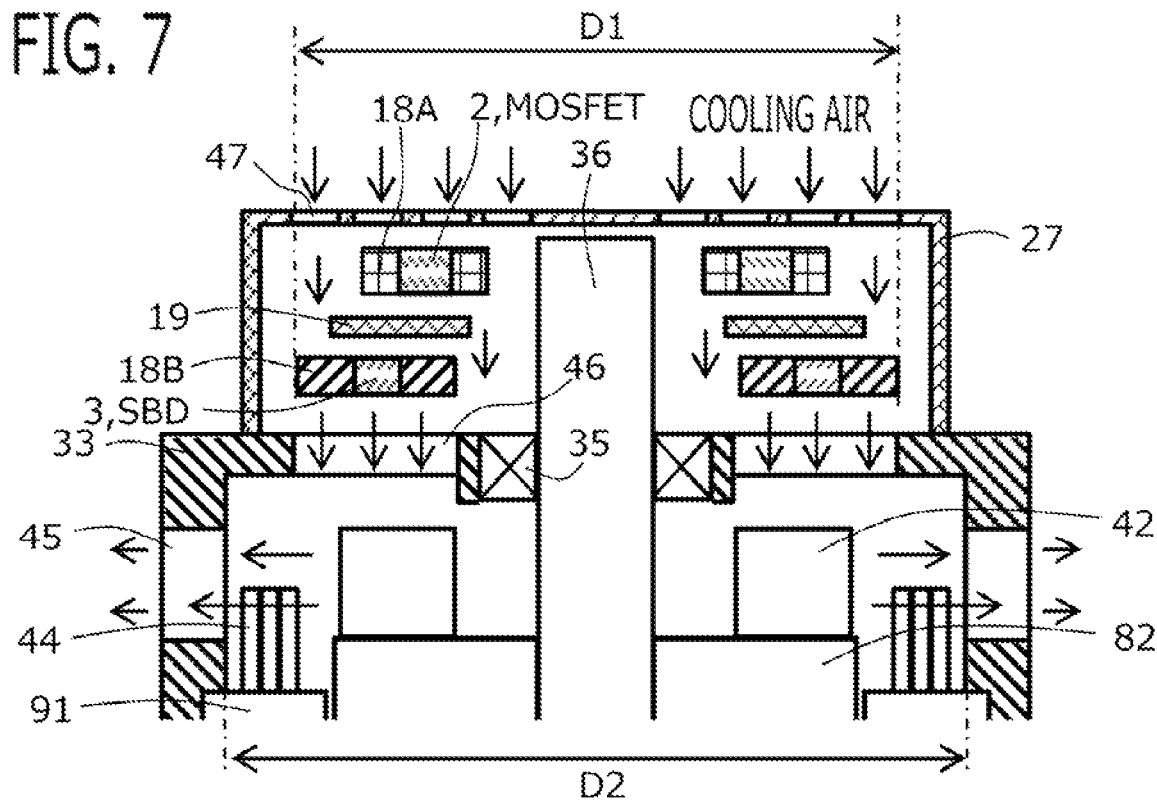
FIG. 7 is a schematic partial cross-sectional view of the vehicle power generator according to Embodiment 1.

FIG. 7 illustrates a schematic partial cross-sectional view of the vehicle power generator 10, for explaining the flow of rear-side cooling air and the arrangement of respective members. As illustrated in FIGS. 6 and 7, a front-side fan 41 having two or more blades is mounted at the front-side end portion of the magnetic-field iron core 82, and a rear-side fan 42 having two or more blades is mounted at the rear-side end portion of the magnetic-field iron core 82; the front-side fan 41 and the rear-side fan 42 rotate integrally with the rotor 38. The front-side fan 41 and the rear-side fan 42 blow air toward the radial outside so as to cool the front-side coil end portion 43, the rear-side coil end portion 44, and the like arranged at the radial outside.

Two or more discharge outlets 45 are formed in a circumferentially distributed manner in the outer circumference wall portion of the front-side housing 32 at the radial outside of the front-side fan 41 and in the outer circumference wall portion of the rear-side housing 33 at the radial outside of the rear-side fan 42. The air blown toward the radial outside by the front-side fan 41 passes through the discharge outlets 45 in the front-side housing 32 so as to be discharged to the outside; the air blown toward the radially outside by the rear-side fan 42 passes through the discharge outlets 45 in the rear-side housing 33 so as to be discharged to the outside.

Two or more suction inlets 46 are formed in a circumferentially distributed manner in the side wall portion of the front-side housing 32 at the front side of the front-side fan 41 and in the side wall portion of the rear-side housing 33 at the rear side of the rear-side fan 42. Air sucked by the front-side fan 41 passes through the suction inlet 46 in the side wall of the front-side housing 32 and then flows from the front side to the rear side. Air sucked by the rear-side fan 42 passes through the suction inlet 46 in the side wall of the rear-side housing 33 and then flows from the rear side to the front side.

The rectifier 1, a pair of brushes 48, a brush holder 49, and circuits such as the voltage control circuit 12 and the like are arranged in the cylindrical tubular space at the radial outside of the rear-side protruding portion of the rotation axle 36 protruding toward the rear side from the rear-side housing 33. The brushes 48 in the pair slide on the respective corresponding slip rings 40 in the pair, and the brush holder 49 contains the brushes 48. As described above, the voltage control circuit 12 controls electric power to be supplied to the magnetic-field winding 14 through the intermediary of the brushes 48 and the slip rings 40.

The radial outside and the rear side of the cylindrical tubular circuit arrangement space is covered with a protection cover 27. The protection cover 27 has a cylindrical tubular outer circumference wall and a discoidal side wall extending from the rear-side end portion of the outer circumference wall toward the radial inside. A connector 20 for inputting and outputting signals between the voltage control circuit 12 and external apparatuses (unillustrated) is fixed to the outer circumference portion of the protection cover 27.

Two or more suction inlets 47 are formed in the side wall of the protection cover 27 in a circumferentially and radially distributed manner. Air to be sucked by the suction inlet 46 in the side wall of the rear-side housing 33 passes through the suction inlet 47 in the side wall of the protection cover 27 and then flows from the rear side to the front side. In this manner, cooling air flows from the rear side to the front side in the protection cover 27, so that each of the circuits arranged in the protection cover 27 is cooled.

Arrangement of Circuits

As described above, in comparison with the positive electrode side MOSFET, the rectification loss in the negative electrode side SBD is large and hence the amount of generated heat becomes large. As illustrated in FIG. 7, the negative electrode side SBD is disposed at the downstream side of the positive electrode side MOSFET in the cooling air. In the present embodiment, the negative electrode side SBD is disposed at the front side of the positive electrode side MOSFET. On the contrary to the present embodiment, when the large-heat-generating SBD is disposed at the upstream side, cooling of the SBD is raised; however, because the cooling air is warmed at the upstream side, cooling of the MOSFET at the downstream side is deteriorated. In the present embodiment, because the small-heat-generating MOSFET is disposed at the upstream side, the MOSFET at the upstream side can satisfactorily be cooled; in addition to that, the temperature of the cooling air at the upstream side can be suppressed from rising and hence cooling of the SBD at the downstream side can be suppressed from being deteriorated. That is to say, the arrangement in the present embodiment can raise the whole cooling efficiency in the SBD and the MOSFET.

The negative electrode side SBD is characterized in that as the temperature rises, the forward drop voltage thereof from the negative electrode side to the positive electrode side becomes smaller. In the present embodiment, because the negative electrode side SBD is disposed at the downstream side of the positive electrode side MOSFET in the cooling air, the temperature of the SBD can be raised in comparison with the case where the negative electrode side SBD is disposed at the upstream side of the positive electrode side MOSFET in the cooling air. Accordingly, the forward drop voltage of the SBD can be decreased and hence the rectification loss in the SBS can be reduced. When the temperature of the SBD rises, the leakage current in the SBD becomes large; however, because the positive electrode side MOSFET reduces the leakage current, the leakage current in the series circuit is suppressed from increasing.

The rectifier 1 has a positive electrode side heat sink 18A and a negative electrode side heat sink 18B. All of the positive electrode side MOSFETs are fixed to the positive electrode side heat sink 18A. All of the negative electrode side SBDs are fixed to the negative electrode side heat sink 18B. The negative electrode side heat sink 18B to which the SBDs are fixed is disposed at the downstream side (at the front side, in this example) of the positive electrode side heat sink 18A to which the MOSFETs are fixed, in the cooling air.

This configuration makes it possible that also when the SBD and the MOSFET are each cooled through the intermediary of the heat sink, the whole cooling efficiency in the SBD and the MOSFET is raised and the rectification loss in the SBD is decreased.

In order to configure the circuit in FIG. 1, the rectifier 1 has a circuit board 19 for connecting the positive electrode side MOSFETs, the negative electrode side SBDs, the windings 9U, 9V, and 9W of the three phases, the positive electrode side output terminal 5, and the negative electrode side output terminal 6.

Figure 8:
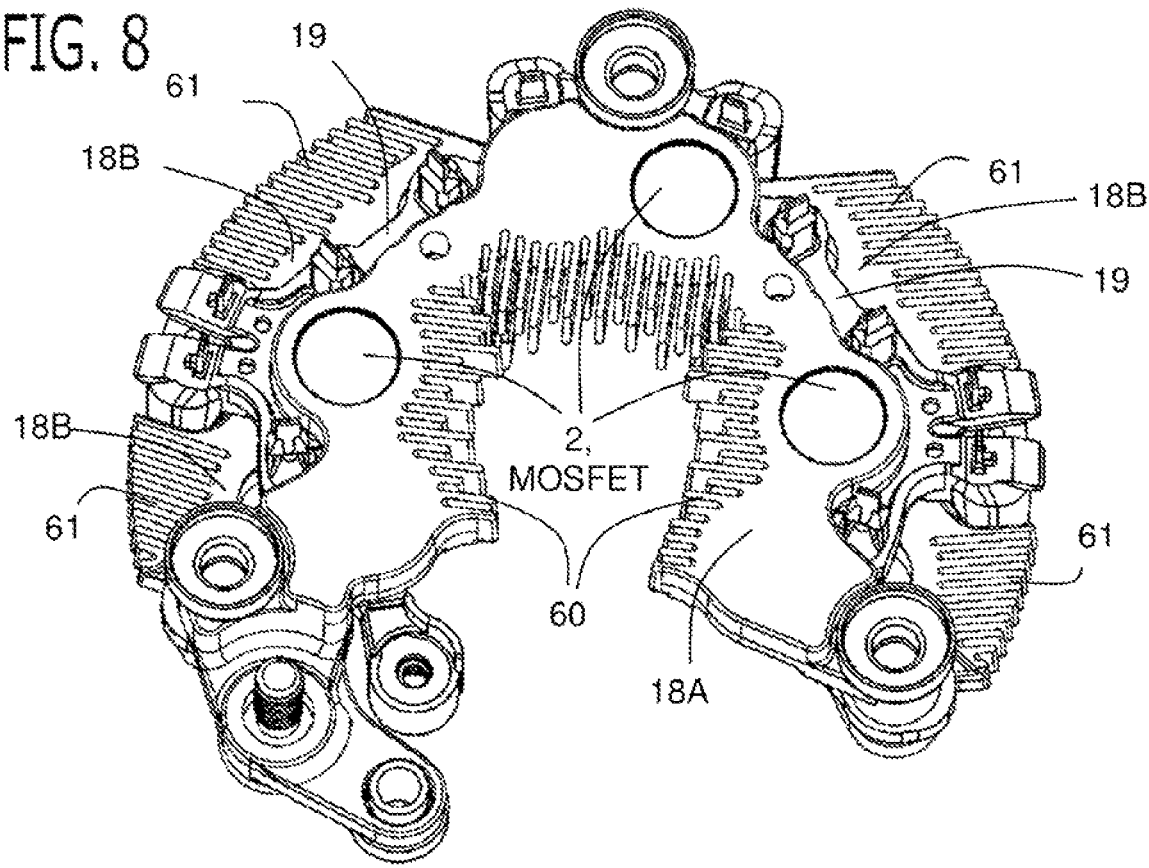
FIG. 8 is a partial perspective view of the rectifier according to Embodiment 1.
Figure 9:
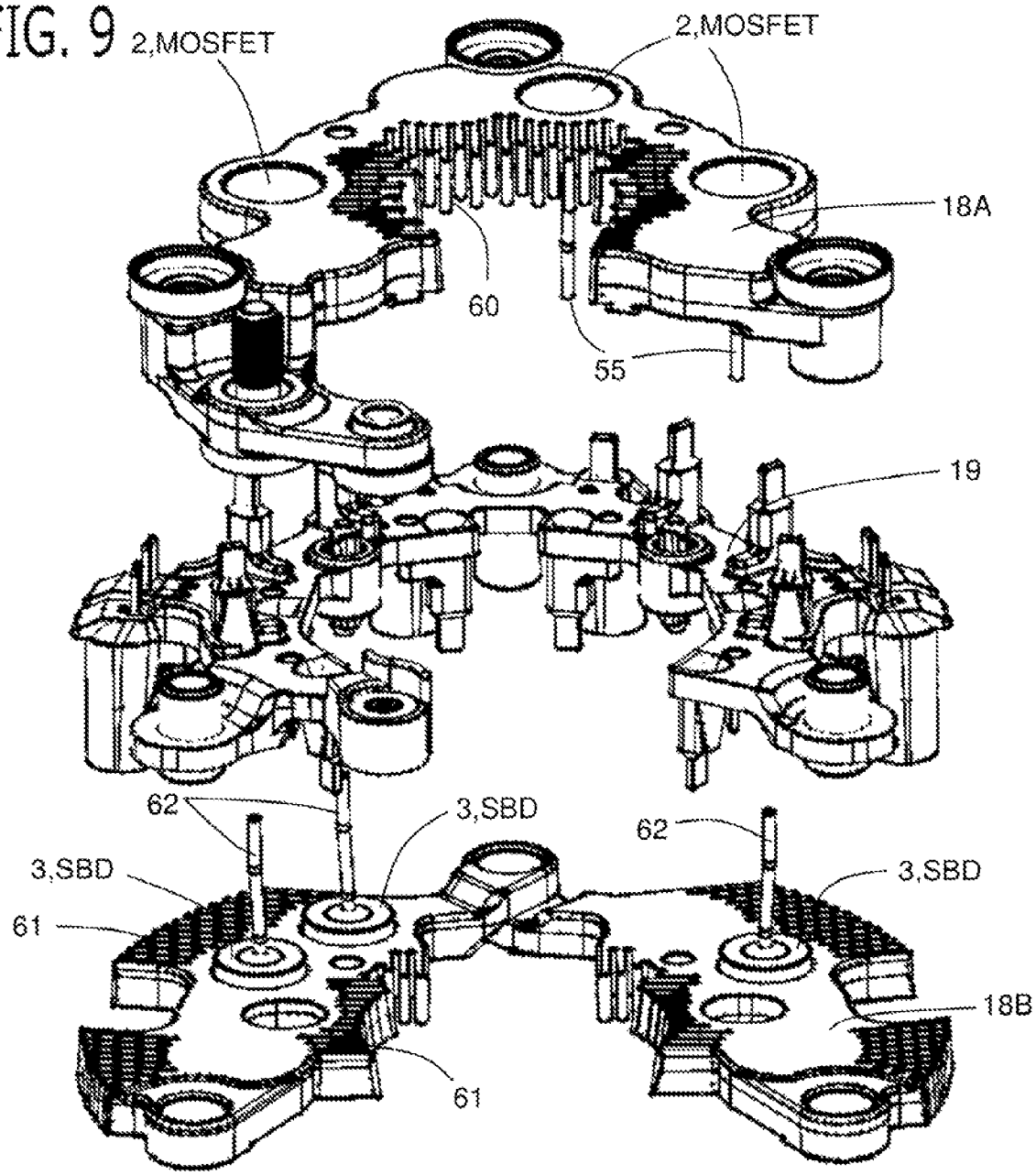
FIG. 9 is an exploded partial perspective view of the rectifier according to Embodiment 1.

FIG. 8 is a partial perspective view of the positive electrode side heat sink 18A to which the MOSFETs are fixed, the negative electrode side heat sink 18B to which the SBDs are fixed, and the circuit board 19 at a time when obliquely viewed from the rear side. FIG. 9 is an exploded partial perspective view of the positive electrode side heat sink 18A, the negative electrode side heat sink 18B, and the circuit board 19 at a time when exploded in the axial direction and then obliquely viewed from the rear side.

As illustrated in FIGS. 7, 8, and 9, the circuit board 19 is pinched between the positive electrode side heat sink 18A and the negative electrode side heat sink 18B in the flow direction of cooling air.

All of the positive electrode side MOSFETs are arranged on the same plane, and all of the negative electrode side SBDs are arranged on the same plane. The plane on which all of the positive electrode side MOSFETs are arranged and the plane on which all of the negative electrode side SBDs are arranged are shifted from each other in the flow direction of cooling air (the axial direction, in this example). This configuration makes it possible to homogenize the temperatures of the positive electrode side MOSFETs arranged on the same plane and to equalize the temperatures of the negative electrode side SBDs arranged on the same plane. In the present embodiment, the plane on which all of the positive electrode side MOSFETs are arranged and the plane on which all of the negative electrode side SBDs are arranged are perpendicular to the flow direction of cooling air (the axial direction, in this example). Accordingly, respective breezes of cooling air to the MOSFETs and the SBDs can be equalized and hence the respective temperatures thereof can be equalized.

In the present embodiment, in the flat-plate-shaped portion of the positive electrode side heat sink 18A, a cylindrical columnar through-hole penetrating it in the flow direction of cooling air (the axial direction, in this example) is formed; a cylindrical columnar MOSFET package is press-fitted into the through-hole. The flat-plate-shaped portions are formed in the shape of an arc plate in such a way as to surround the rotation axle 36; three through-holes are formed in a circumferentially distributed manner. Two or more fins 60 parallel to the flow direction are provided in the inner circumference portion of the arc-plate-shaped portion, so that the cooling performance is raised.

Figure 10:
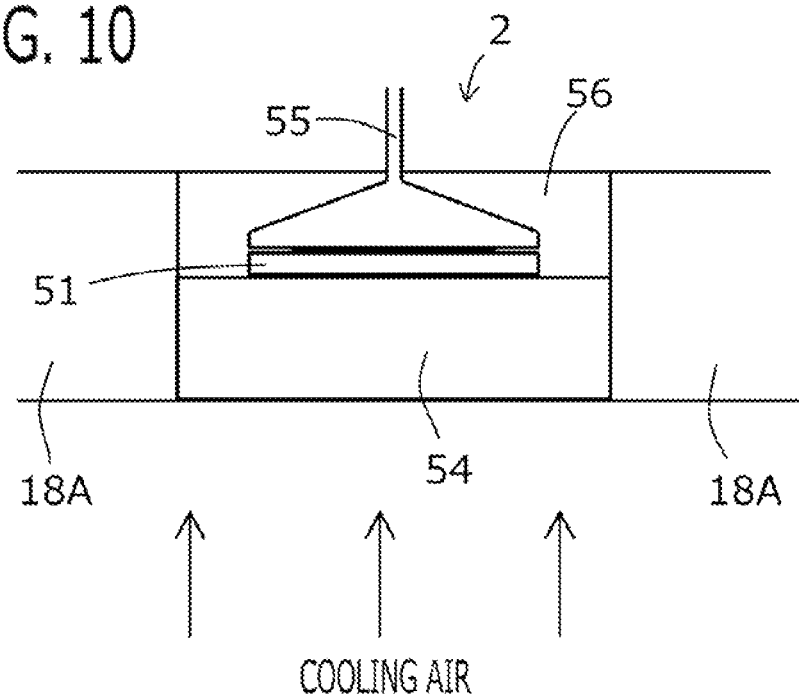
FIG. 10 is a schematic cross-sectional view of a MOSFET package according to Embodiment 1.
Figure 11:
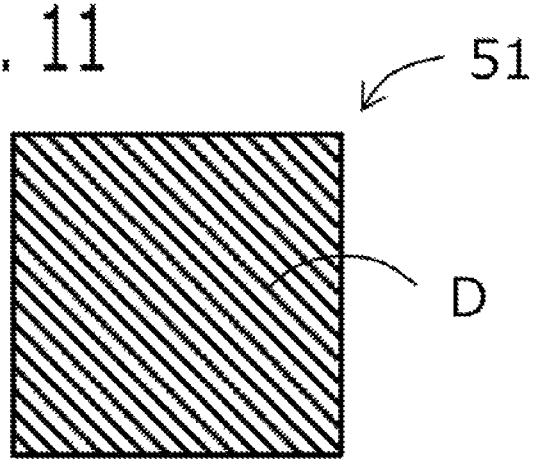
FIG. 11 is a view of one side of a MOSFET chip according to Embodiment 1.
Figure 12:
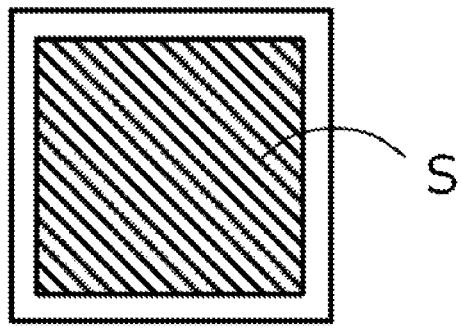
FIG. 12 is a view of the other side of the MOSFET chip according to Embodiment 1.

As illustrated in a post-press-fitting cross-sectional view in FIG. 10, the MOSFET package has a cylindrical columnar copper base portion 54, a flat-plate-shaped MOSFET chip 51, a lead portion 55, and an epoxy resin 56. As illustrated in FIG. 11, the drain terminal D is provided on one side of the MOSFET chip 51; the drain terminal D is bonded to one side of the base portion 54 through soldering. The drain terminal D is connected with the positive electrode side output terminal 5 through the intermediary of the base portion 54 and the positive electrode side heat sink 18A. As illustrated in FIG. 12, the source terminal S is provided on the other side of the MOSFET chip 51; the source terminal S is bonded to the lead portion 55 through soldering. The lead portion 55 is connected with the circuit board 19 and is connected with the negative electrode side SBD and the winding through the intermediary of the circuit board 19. In addition, the control circuit 8 (IC) is contained in the MOSFET chip 51. Then, the one side of the base portion 54, the MOSFET chip 51, and the connection portion of the lead portion 55 are potted with the epoxy resin 56 so as to be formed in the shape of a cylindrical column having a cross-sectional area the same as that of the base portion 54.

In the present embodiment, because an electric-inspection terminal is provided in the side of the source terminal S, the area of the source terminal S is smaller than that of the drain terminal D. Therefore, the drain terminal D having a small thermal resistance is connected with the base portion 54 and the positive electrode side heat sink 18A that each have a large heat mass, so that the coolability thereof is raised. Moreover, the MOSFET package is disposed so as to be oriented in a direction where the base portion 54 is situated at the windward (the rear side) and the lead portion 55 is situated at the leeward (the front side). Accordingly, because at the most upstream side, cooling air can be blown to the base portion 54 to which heat generated in the MOSFET is transferred, the coolability of the MOSFET is raised.

In the flat-plate-shaped portion of the negative electrode side heat sink 18B, a cylindrical columnar through-hole penetrating it in the flow direction of cooling air (the axial direction, in this example) is formed; a cylindrical columnar SBD package is press-fitted into the through-hole. The flat-plate-shaped portions are formed in the shape of an arc plate in such a way as to surround the rotation axle 36; three through-holes are formed in a circumferentially distributed manner. Two or more fins 61 parallel to the flow direction are provided in the outer and inner circumference portions of the arc-plate-shaped portion, so that the cooling performance is raised. The flat-plate-shaped portion of the positive electrode side heat sink 18A and the flat-plate-shaped portion of the negative electrode side heat sink 18B are arranged in such a way as to overlap each other when viewed in the flow direction (the axial direction); the circuit board 19 is disposed between the two flat-plate-shaped portions.

As is the case with the MOSFET package, the SBD package has a cylindrical columnar copper base portion, a flat-plate-shaped SBD chip, a lead portion, and an epoxy resin. The anode terminal A is provided on one side of the SBD chip; the anode terminal A is bonded to one side of the base portion through soldering. The anode terminal A is connected with the negative electrode side output terminal 6 through the intermediary of the base portion and the negative electrode side heat sink 18B. The cathode terminal K is provided on the other side of the SBD chip; the cathode terminal K is bonded to a lead portion 62 through soldering. The lead portion 62 is connected with the circuit board 19 and is connected with the positive electrode side MOSFET and the winding through the intermediary of the circuit board 19. Then, the one side of the base portion, the SBD chip, and the connection portion of the lead portion 62 are potted with the epoxy resin so as to be formed in the shape of a cylindrical column having a cross-sectional area the same as that of the base portion.

As described above, in comparison with the comparative example in which an SBD is utilized as each of the positive electrode side semiconductor device and the negative electrode side semiconductor device, the present embodiment in which a MOSFET is utilized at the positive electrode side and an SBD is utilized at the negative electrode side makes it possible to reduce the rectification loss by 35%. Moreover, as described above, the coolability of each of the semiconductor devices is raised by contriving the arrangement and the configuration. Accordingly, the heat sink for cooling each of the semiconductor devices can be downsized. Therefore, the outer diameter D1 of each of the positive electrode side heat sink 18A and the negative electrode side heat sink 18B can be reduced. For example, as illustrated in FIGS. 6 and 7, the outer diameter D1 of each of the positive electrode side heat sink 18A and the negative electrode side heat sink 18B can be made smaller than the inner diameter D2 of the outer circumference wall of the rear-side housing 33 (in particular, the inner diameter of the outer circumference wall portion where the discharge outlet 45 is provided). Because the outer diameter D1 of the heat sink is reduced, the suction inlet 47 provided in the rear-side side wall of the protection cover 27 can be disposed at the radial inside. As a result, the distance between the suction inlet 47 and the discharge outlet 45 can be lengthened, so that warm air discharged from the discharge outlet 45 is not likely to be re-sucked through the suction inlet 47 and hence the cooling performance is raised.

Moreover, because the rectification loss can be reduced, the temperature of cooling air to be sucked by the rear-side housing 33 after having cooled the rectifier 1 can be suppressed from rising. Accordingly, the coolability of each of the rear-side coil end portion 44, the rear-side bearing 35, and the like contained in the rear-side housing 33 is raised. Accordingly, not only the temperature of the rectifier 1 but also the temperature of the whole vehicle power generator 10 is suppressed from rising, so that the reliability of the vehicle power generator 10 can be enhanced. Moreover, because when the respective temperatures of the windings 9U, 9V, and 9W of the three phases fall, the generated current can be increased, so that the output of the vehicle power generator 10 can be enhanced.

2. Embodiment 2

Figure 13:
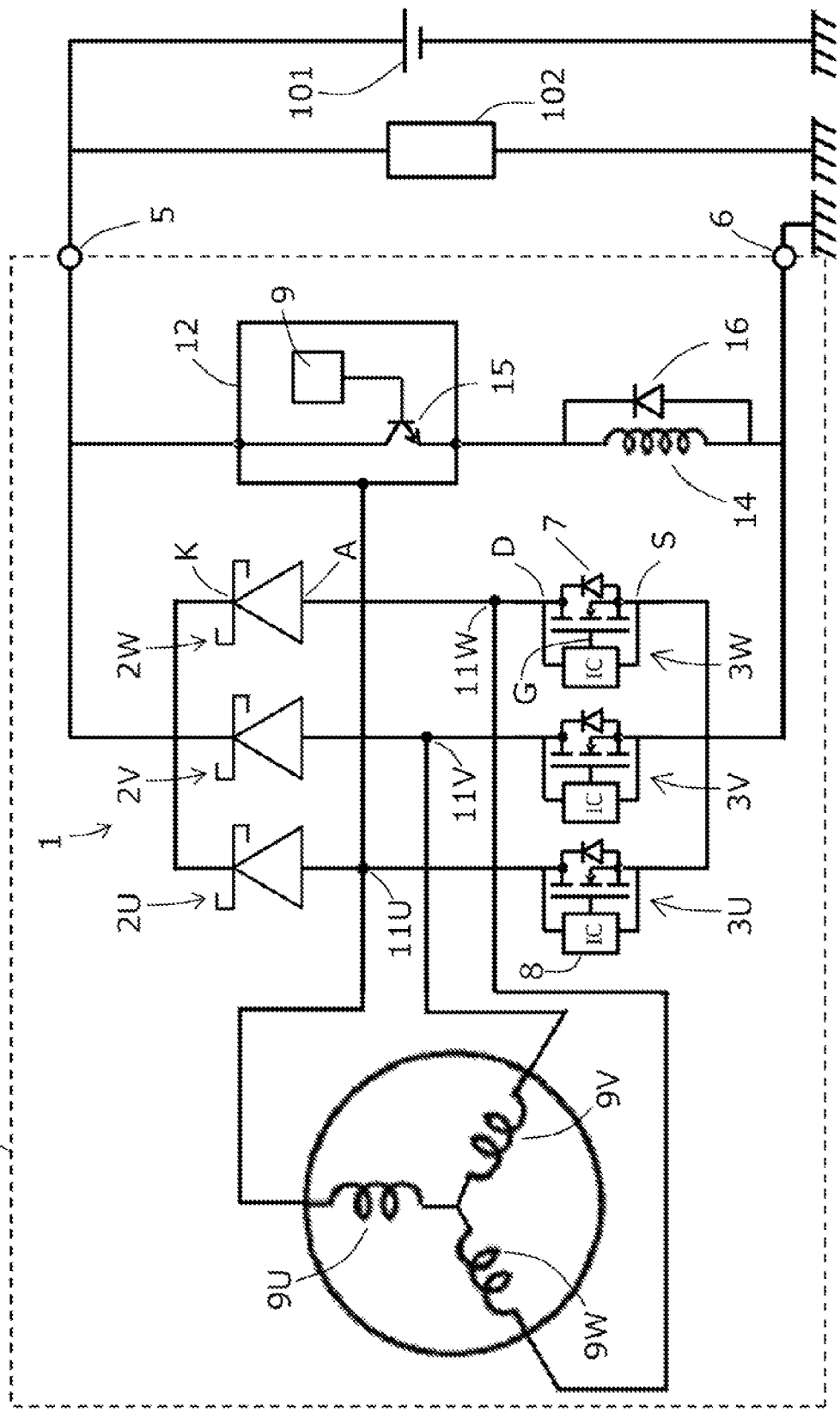
FIG. 13 is a circuit diagram of a rectifier and a vehicle power generator according to Embodiment 2.

Next, a rectifier 1 and a vehicle power generator 10 according to Embodiment 2 will be explained. The explanation for constituent parts the same as those in Embodiment 1 will be omitted. The present embodiment is different from Embodiment 1 in that as represented by the circuit diagram in FIG. 13, in each of the three sets, the positive electrode side semiconductor devices 2 is an SBD and in each of the three sets, the negative electrode side semiconductor devices 3 is a MOSFET.

In the series circuit of each phase, the cathode terminal K of the positive electrode side SBD is connected with the positive electrode side output terminal 5; the anode terminal A of the positive electrode side SBD is connected with the drain terminal D of the negative electrode side MOSFET; the source terminal S of the negative electrode side MOSFET is connected with the negative electrode side output terminal 6. The connection point 11 at which the positive electrode side SBD and the negative electrode side MOSFET are connected with each other is connected with the corresponding winding.

Figure 14:
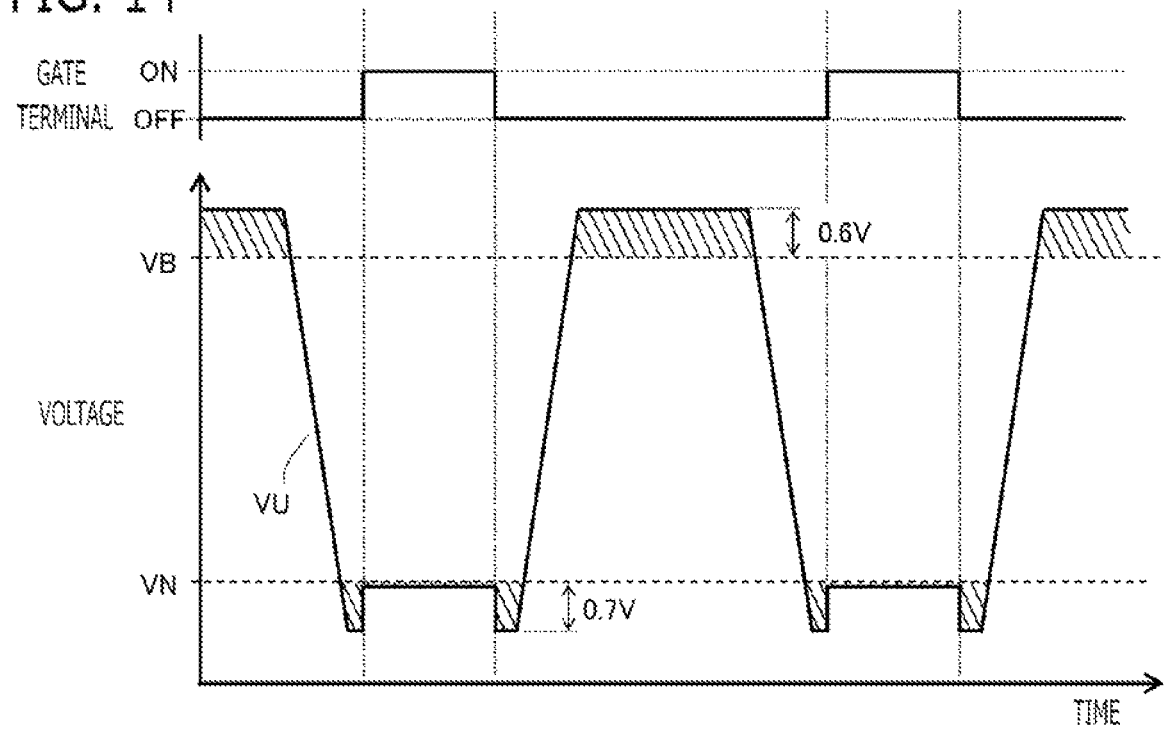
FIG. 14 is a timing chart for explaining a phase voltage waveform according to Embodiment 2.

Each of the negative electrode side MOSFETs has an IC as the control circuit 8 the same as that in Embodiment 1 and on/off-drives the MOSFET. FIG. 14 represents the phase voltage waveform of any one of the phases (e.g., U phase). In a time period during which the voltage VN of the negative electrode side output terminal 6 (the voltage of the source terminal S) is higher than the U-phase phase voltage VU (the voltage of the drain terminal D), the U-phase negative electrode side MOSFET is turned on. In the present embodiment, in the both sides of the time period during which the voltage VN is higher than the U-phase phase voltage VU, the U-phase negative electrode side MOSFET is turned off.

As is the case with FIG. 2 in Embodiment 1, when the MOSFET is on, the drop voltage from the source terminal S to the drain terminal D becomes 0.1 V or smaller. In contrast, in the time period during which the voltage VB of the positive electrode side output terminal 6 (the voltage of the cathode terminal K) is lower than the U-phase phase voltage VU (the voltage of the anode terminal A), the drop voltage from the anode terminal A to the cathode terminal K becomes substantially 0.6 V, which is the forward drop voltage of the SBD.

Thus, as is the case with Embodiment 1, in comparison with the comparative example in which an SBD is utilized as each of the positive electrode side semiconductor device and the negative electrode side semiconductor device, the present embodiment in which an SBD is utilized at the positive electrode side and a MOSFET is utilized at the negative electrode side also makes it possible to reduce the rectification loss by 35%; thus, the power generation efficiency of the vehicle power generator 10 can be raised.

The negative electrode side MOSFET can reduce the leakage current in each of the series circuits; thus, even when the device temperature rises, the leakage current that flows in each of the series circuits can be suppressed from increasing.

Also in the present embodiment, the breakdown voltage of the positive electrode side SBD is lower than the clamp voltage of the negative electrode side MOSFET. When for example, the positive electrode side output terminal 5 is disconnected during power generation and hence a high-voltage surge occurs, the positive electrode side SBD breaks down before the clamp circuit of the negative electrode side MOSFET operates. As is the case with Embodiment 1, the terminal voltage of each of the windings 9U, 9V, and 9W of the three phases can be fixed to the breakdown voltage of the positive electrode side SBD, so that it is made possible to prevent an excessive voltage from being applied to the negative electrode side MOSFET. The MOSFET can be protected from a high-voltage surge and the high-voltage surge can efficiently be attenuated through the power consumption in the SBD.

Figure 15:
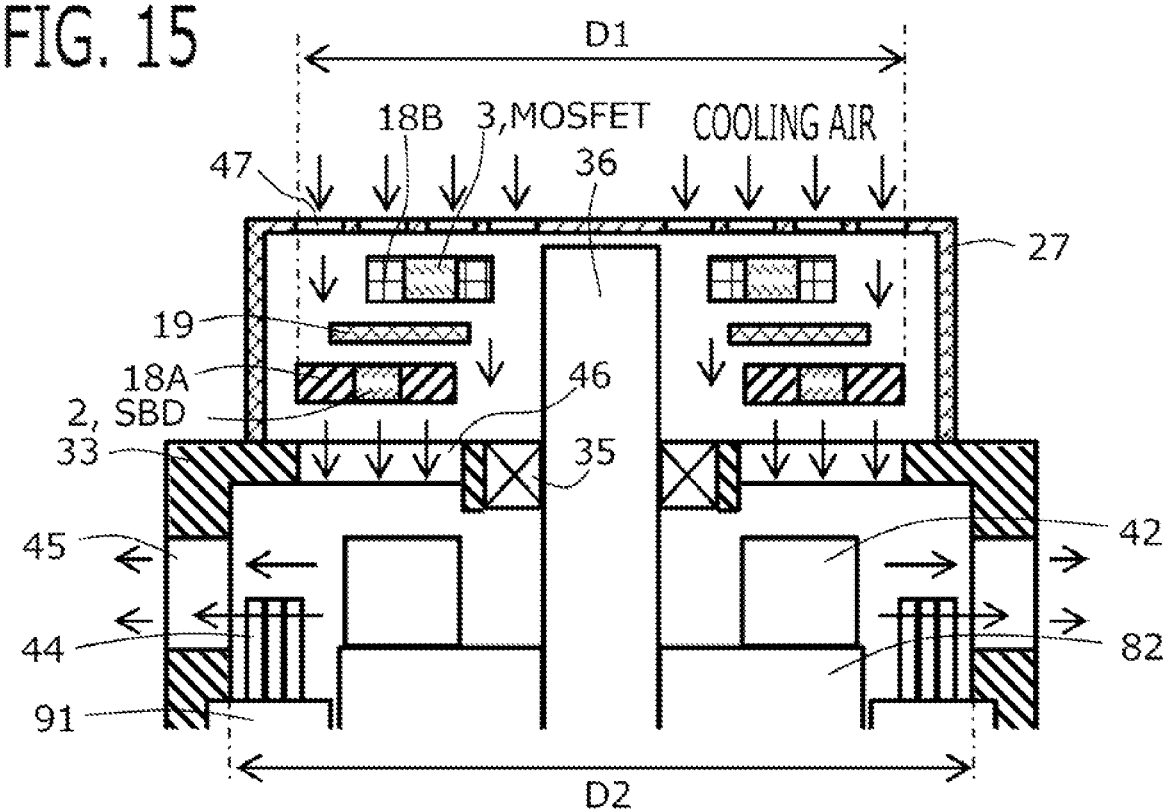
FIG. 15 is a schematic partial cross-sectional view of the vehicle power generator according to Embodiment 2.

Also in the present embodiment, as illustrated in FIG. 15, the positive electrode side SBD is disposed at the downstream side of the negative electrode side MOSFET in the cooling air. The positive electrode side heat sink 18A to which the SBDs are fixed is disposed at the downstream side (at the front side, in this example) of the negative electrode side heat sink 18B to which the MOSFETs are fixed, in the cooling air. Accordingly, the whole cooling efficiency in the SBD and the MOSFET can be enhanced; in addition, because the forward drop voltage of the SBD is reduced by raising the temperature of the SBD, the rectification loss in the SBD can be decreased.

The circuit board 19 is pinched between the positive electrode side heat sink 18A and the negative electrode side heat sink 18B in the flow direction of cooling air. All of the negative electrode side MOSFETs are arranged on the same plane, and all of the positive electrode side SBDs are arranged on the same plane. The plane on which all of the negative electrode side MOSFETs are arranged and the plane on which all of the positive electrode side SBDs are arranged are shifted from each other in the flow direction of cooling air (the axial direction, in this example).

As is the case with Embodiment 1, through-holes are formed in the heat sinks 18A and 18B; a MOSFET package and a SBD package are press-fitted into the respective through-holes. Each of the MOSFET package and the SBD package is configured in the same manner as that in Embodiment 1. Moreover, the MOSFET package is disposed so as to be oriented in a direction where the base portion 54 is situated at the windward (the rear side) and the lead portion 55 is situated at the leeward (the front side). The negative electrode side heat sink 18B to which the MOSFETs are fixed is disposed at the upstream side of the positive electrode side heat sink 18A to which the SBDs are fixed; therefore, because at the most upstream side, cooling air can be blown to the base portion 54 to which heat generated in the MOSFET is transferred, the coolability of the MOSFET is raised. The outer diameter of each of the positive electrode side heat sink 18A and the negative electrode side heat sink 18B is made smaller than the inner diameter of the outer circumference wall of the rear-side housing 33 (in particular, the inner diameter of the outer circumference wall portion where the discharge outlet 45 is provided).

3. Embodiment 3

Next, a rectifier 1 and a vehicle power generator 10 according to Embodiment 3 will be explained. The explanation for constituent parts the same as those in Embodiment 1 or Embodiment 2 will be omitted. In each of Embodiments 1 and 2, the forward drop voltage of the SBD is substantially 0.6 V under the condition of 25° C. and 100 A energization. In the present embodiment, there is utilized an ultra-low forward drop voltage SBD whose forward drop voltage is lower than 0.6 V, for example, 0.3 V to 0.4 V, under the condition of 25° C. and 100 A energization.

When the forward drop voltage of the SBD is lower than 0.6 V, a problem that the leakage current becomes large is posed. When an SBD is utilized as each of the positive electrode side semiconductor device and the negative electrode side semiconductor device, there exists an anxiety of a thermal runaway caused by the leakage current; therefore, it is difficult to adopt an SBD whose forward drop voltage is lower than 0.6 V, without utilizing a special circuit such as a leakage current control circuit.

However, in the present embodiment, because the positive electrode side MOSFET or the negative electrode side MOSFET can reduce leakage current, it is made possible that even when an SBD whose forward drop voltage is lower than 0.6 V is utilized, the leakage current in the whole series circuit can be suppressed from increasing. The trade-off between a decrease in the forward drop voltage of the SBD and an increase in the leakage current thereof can be solved by providing a MOSFET at the positive electrode side or at the negative electrode side.

Because the forward drop voltage of the SBD can be made lower than 0.6 V, the rectification loss can be reduced more than in each of Embodiments 1 and 2. Moreover, because the voltage drop caused by the forward drop voltage of the SBD can be suppressed, the output of the rectifier 1 increases. As a result, the rectifier 1 of a high efficiency and a high output can be obtained.

In order to improve the trade-off between a decrease in the forward drop voltage of an SBD and an increase in the leakage current thereof, a large man-hour has been spent in developing the SBD; for example, in the internal structure of the SBD, the shape of the P layer to be arranged inside the guard ring has been made stripe-shaped or dot-shaped; therefore, the cost of the SBD has increased. In the present embodiment, because the development man-hour for the SBD can be reduced, it is not required to utilize an expensive SBD.

Other Embodiments

Lastly, other embodiments of the present disclosure will be explained. Each of the configurations of embodiments to be explained below is not limited to be separately utilized but can be utilized in combination with the configurations of other embodiments as long as no discrepancy occurs.

(1) In foregoing Embodiment 1, there has been explained, as an example, the case where in each of the three sets, the negative electrode side semiconductor device 3 is an SBD; in foregoing Embodiment 2, there has been explained, as an example, the case where in each of the three sets, the positive electrode side semiconductor device 2 is an SBD. However, embodiments of the present disclosure are not limited to the foregoing cases. That is to say, in Embodiment 1, it is only necessary that the negative electrode side semiconductor device 3 in at least one of the three sets is an SBD; for example, it may be allowed that the negative electrode side semiconductor device 3 in one of the three sets is an SBD or the negative electrode side semiconductor devices 3 in two of the three sets are SBDs. It may be allowed that the residual negative electrode side semiconductor device 3 in the set where no SBD is utilized is a MOSFET similar to the positive electrode side MOSFET or a PN-junction diode. In Embodiment 2, it is only necessary that the positive electrode side semiconductor device 2 in at least one of the three sets is an SBD; for example, it may be allowed that the positive electrode side semiconductor device 2 in one of the three sets is an SBD or the positive electrode side semiconductor devices 2 in two of the three sets are SBDs. It may be allowed that the residual positive electrode side semiconductor device 2 in the set where no SBD is utilized is a MOSFET similar to the negative electrode side MOSFET or a PN-junction diode.

(2) In each of foregoing Embodiments, there has been explained, as an example, the case where three sets of series circuits are provided and, as the AC power sources, the windings 9U, 9V, and 9W of three phases are provided, so that a three-phase full-wave rectification circuit is realized. However, embodiments of the present disclosure are not limited to the foregoing case. That is to say, it is only necessary that the number of the sets of the series circuits is the same as or larger than 2. For example, it may be allowed that as the AC power sources, two sets of windings of three phases are provided and six sets of series circuits are provided, that as the AC power sources, windings of five phases are provided and five sets of series circuits are provided, or that the AC power source is a single-phase commercial AC power source or the like and as a single-phase full-wave rectification circuit, two sets of series circuits are provided.

(3) In each of the foregoing embodiments, there has been explained, as an example, the case where the rectifier 1 is provided in the vehicle power generator 10. However, embodiments of the present disclosure are not limited to the foregoing case. That is to say, it may be allowed that the rectifier 1 is utilized in an apparatus other than the vehicle power generator 10. For example, it may be allowed that the rectifier 1 is utilized in a power generator utilizing wind power, water power, or the like or that the rectifier 1 is utilized in a conversion apparatus for converting a commercial AC power source into a DC power source.

(4) In each of the foregoing embodiments, there has been explained, as an example, the case where as the specific diode, a Schottky barrier diode SBD is utilized. However, embodiments of the present disclosure are not limited to the foregoing case. That is to say, it may be allowed that as the specific diode, a MOS diode, which is a MOSFET whose drain terminal and gate terminal are short-circuited, is utilized. The drain terminal of the MOS diode is connected with the positive electrode side, and the source terminal thereof is connected with the negative electrode side. The forward drop voltage of a MOS diode from the source terminal to the drain terminal is larger than the drop voltage of a normal MOSFET at a time when the normal MOSFET is on, and becomes equal to the forward drop voltage of an SBD. The leakage current of a MOS diode from the drain terminal to the source terminal is equal to the leakage current of a normal MOSFET and is smaller than the leakage current of an SBD. Accordingly, even when as the specific diode, a MOS diode is utilized, the rectification loss and the leakage current can be reduced. Because it requires neither the control circuit 8 nor the clamp circuit, a MOS diode is less expensive than a MOSFET that requires the control circuit 8 and the clamp circuit. Moreover, it may be allowed that as the SBD, each of various kinds of SBDs such as a junction barrier Schottky diode and the like is utilized.

(5) In each of foregoing Embodiments 1 and 2, there has been explained, as an example, the case where the forward drop voltage of the SBD is substantially 0.6 V under the condition of 25° C. and 100 A energization; in Embodiment 3, there has been explained, as an example, the case where the forward drop voltage of the SBD is substantially 0.3 V to 0.4 V under the condition of 25° C. and 100 A energization. However, it is only necessary that the forward drop voltage of the SBD is within a range, for example, from 0.3 V to 0.65 V under the condition of 25° C. and 100 A energization.

(6) In each of the foregoing embodiments, there has been explained, as an example, the case where each of the MOSFETs is provided with an IC as the control circuit 8. However, embodiments of the present disclosure are not limited to the foregoing case. In other words, it may be allowed that as the control circuit 8, only a single control circuit is provided for all of the MOSFETs and that for each of the MOSFETs, the single control circuit outputs an ON-signal to the gate terminal G so as to turn on the MOSFET, when the voltage of the source terminal S exceeds the voltage of the drain terminal D.

Figure 16:
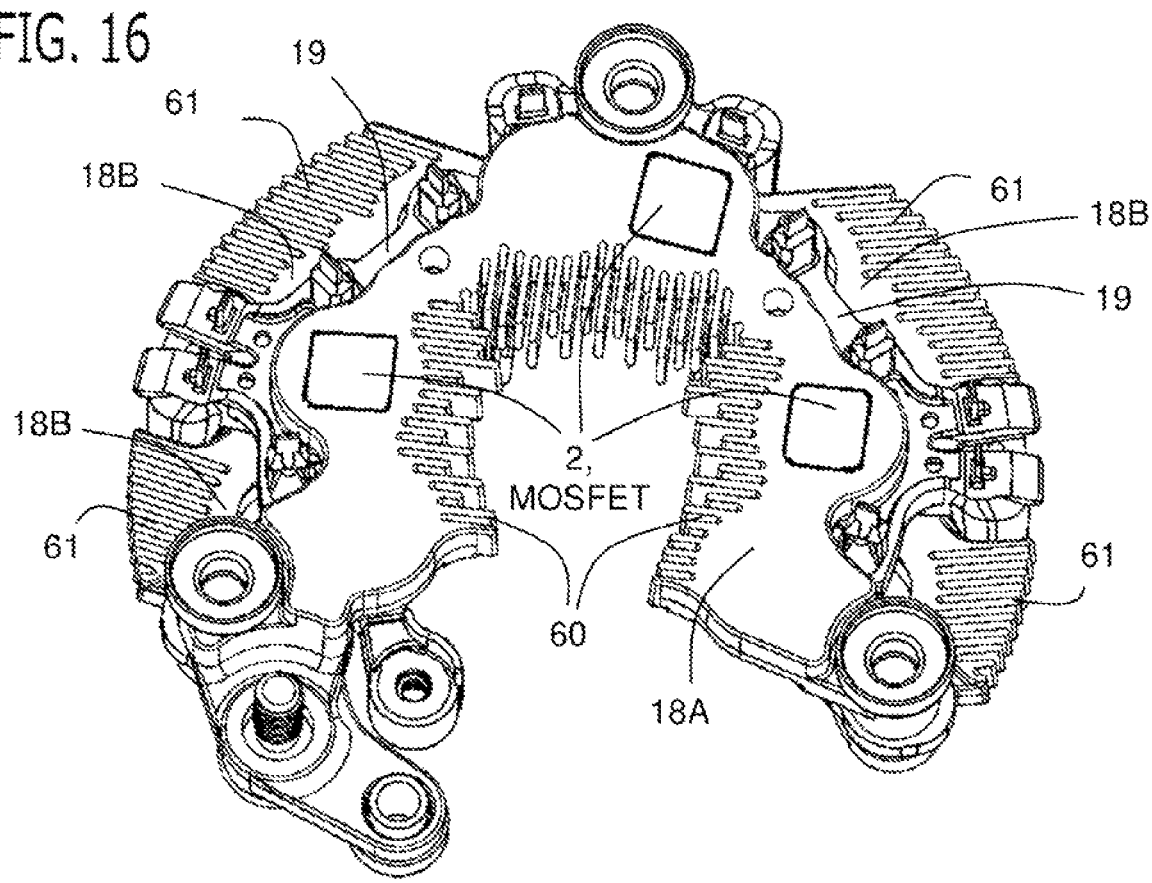
FIG. 16 is a partial perspective view of a rectifier according to another embodiment.

(7) In each of foregoing Embodiments, there has been explained, as an example, the case where in each of the positive electrode side heat sink and the negative electrode side heat sink, a cylindrical columnar through-hole penetrating it in the flow direction of cooling air (the axial direction) is formed, and a cylindrical columnar MOSFET package or SBD package is press-fitted into the through-hole. However, embodiments of the present disclosure are not limited to the foregoing case. In other words, as illustrated in the partial perspective view in FIG. 16, it may be allowed that in each of the positive electrode side heat sink and the negative electrode side heat sink, a rectangular-parallelopiped-shaped through-hole penetrating it in the flow direction of cooling air (the axial direction) is foamed, and a rectangular-parallelopiped-shaped MOSFET package or SBD package is press-fitted into the through-hole.

(8) It may be allowed that the solder to be utilized for the MOSFET and the specific diode is either lead-contained solder or lead-free solder. Heat generation in the rectifier 1 is reduced and the cooling performance is raised; therefore, even when lead-free solder is utilized, thermal deterioration can be suppressed from occurring.

Although the present application is described above in terms of various exemplary embodiments and implementations, it should be understood that the various features, aspects and functions described in one or more of the individual embodiments are not limited in their applicability to the particular embodiment with which they are described, but instead can be applied, alone or in various combinations to one or more of the embodiments. Therefore, an infinite number of unexemplified variant examples are conceivable within the range of the technology disclosed in the present disclosure. For example, there are included the case where at least one constituent element is modified, added, or omitted and the case where at least one constituent element is extracted and then combined with constituent elements of other embodiments.

REFERENCE SIGNS LIST

1: rectifier
2: positive electrode side semiconductor device
3: negative electrode side semiconductor device
5: positive electrode side output terminal
6: negative electrode side output terminal
8: control circuit
10: vehicle power generator
11: series-connection connection point
18A: positive electrode side heat sink
18B: negative electrode side heat sink
19: circuit board
34: housing
SBD: Schottky barrier diode

The invention claimed is:

1. A rectifier comprising:
n (n is a natural number of 2 or larger) sets of series circuits in each of which a positive electrode side semiconductor device to be connected with a positive electrode side output terminal and a negative electrode side semiconductor device to be connected with a negative electrode side output terminal are connected in series with each other and a series-connection connection point is connected with a corresponding AC power source,
wherein each of the positive electrode side semiconductor device and the negative electrode side semiconductor device has at least a rectification function of making a current flow from a negative electrode side to a positive electrode side,
wherein in each of the n sets, one of the positive electrode side semiconductor device and the negative electrode side semiconductor device is a MOSFET,
wherein in at least one of the n sets, the other one of the positive electrode side semiconductor device and the negative electrode side semiconductor device is a specific diode,
wherein the specific diode is a Schottky barrier diode, and
wherein a breakdown voltage of the Schottky barrier diode is lower than a clamp voltage of the MOSFET.

2. The rectifier according to claim 1, wherein in each of the n sets, the other one of the positive electrode side semiconductor device and the negative electrode side semiconductor device is the specific diode.

3. The rectifier according to claim 1, further comprising a control circuit for on/off-controlling the MOSFET, wherein when a voltage of the source terminal of the MOSFET exceeds a voltage of the drain terminal of the MOSFET, the control circuit turns on the MOSFET.

4. The rectifier according to claim 1, wherein a forward drop voltage of the Schottky barrier diode from the negative electrode side to the positive electrode side is a voltage within a range from 0.3 V to 0.65 V under the condition of 25° C. and 100 A energization.

5. The rectifier according to claim 1, wherein the specific diode is disposed at a downstream side of the MOSFET in cooling air.

6. The rectifier according to claim 5, wherein the Schottky barrier diode is characterized in that as temperature rises, the drop voltage thereof from the negative electrode side to the positive electrode side becomes smaller.

7. The rectifier according to claim 5,
wherein all of the positive electrode side semiconductor devices are arranged on the same plane, and all of the negative electrode side semiconductor devices are arranged on the same plane, and
wherein the plane on which all of the positive electrode side semiconductor devices are arranged and the plane on which all of the negative electrode side semiconductor devices are arranged are shifted from each other in a flow direction of the cooling air.

8. The rectifier according to claim 5, further comprising a positive electrode side heat sink to which all of the positive electrode side semiconductor devices are fixed and a negative electrode side heat sink to which all of the negative electrode side semiconductor devices are fixed, wherein any one of the positive electrode side heat sink and the negative electrode side heat sink, to which the specific diode is fixed, is disposed at a downstream side of the other one, to which no specific diode is fixed, in the cooling air.

9. The rectifier according to claim 8, further comprising a circuit board for connecting the positive electrode side semiconductor device, the negative electrode side semiconductor device, the AC power source, the positive electrode side output terminal, and the negative electrode side output terminal, wherein the circuit board is pinched between the positive electrode side heat sink and the negative electrode side heat sink in a flow direction of the cooling air.

10. The rectifier according to claim 8, wherein each of respective packages of the positive electrode side semiconductor device and the negative electrode side semiconductor device is cylindrical columnar or rectangular-parallelopiped-shaped and is fitted into a cylindrical columnar or rectangular-parallelopiped-shaped through-hole formed in each of the positive electrode side heat sink and the negative electrode side heat sink.

11. The rectifier according to claim 1, wherein solder to be utilized for the MOSFET and the specific diode is lead-free solder.

12. A vehicle AC generator comprising:
the rectifier according to claim 1, and
windings of n phases, as the AC power sources.

13. The vehicle AC generator according to claim 12, wherein outer diameters of respective heat sinks to which the positive electrode side semiconductor device and the negative electrode side semiconductor device are fixed are each smaller than an inner diameter of an outer circumference wall of a housing for containing the windings of the n phases.

14. The rectifier according to claim 1,
wherein the MOSFET has a clamp circuit, wherein when the drain-source differential voltage obtained by subtracting the voltage of the source terminal of the MOSFET from the voltage of the drain terminal of the MOSFET becomes the same as or larger than the clamp voltage, the clamp circuit is configured to make a current flow from the drain terminal to the source terminal so that the drain-source differential voltage does not exceed the clamp voltage.

* * * * *